United States Patent
Dimitrov et al.

(10) Patent No.: US 8,395,867 B2
(45) Date of Patent: Mar. 12, 2013

(54) MAGNETIC SENSOR WITH A RECESSED REFERENCE LAYER ASSEMBLY AND A FRONT SHIELD

(76) Inventors: Dimitar Velikov Dimitrov, Edina, MN (US); Zheng Gao, Savage, MN (US); Wonjoon Jung, Bloomington, MN (US); Sharat Batra, Plymouth, MN (US); Olle Gunnar Heinonen, Eden Prairie, MN (US)

( * ) Notice: Subject to any disclaimer, the term of this patent is extended or adjusted under 35 U.S.C. 154(b) by 1031 days.

(21) Appl. No.: 12/405,051

(22) Filed: Mar. 16, 2009

(65) Prior Publication Data

US 2010/0232072 A1    Sep. 16, 2010

(51) Int. Cl.
    *G11B 5/39*    (2006.01)
(52) U.S. Cl. ............... 360/319; 360/324.11; 360/324.12
(58) Field of Classification Search .......................... None
    See application file for complete search history.

(56) References Cited

U.S. PATENT DOCUMENTS

| | | | |
|---|---|---|---|
| 6,667,862 B2 | 12/2003 | Zhu | |
| 6,721,139 B2* | 4/2004 | Gill | 360/321 |
| 6,738,236 B1 | 5/2004 | Mao et al. | |
| 6,847,510 B2* | 1/2005 | Childress et al. | 360/324.2 |
| 6,943,993 B2* | 9/2005 | Chang et al. | 360/319 |
| 7,027,272 B2* | 4/2006 | Furukawa et al. | 360/324.12 |
| 7,035,062 B1 | 4/2006 | Mao et al. | |
| 7,092,221 B2* | 8/2006 | Gill | 360/324.11 |
| 7,324,310 B2* | 1/2008 | Gill | 360/324.11 |
| 7,385,842 B2 | 6/2008 | Deak | |
| 7,580,230 B2* | 8/2009 | Freitag et al. | 360/324.12 |
| 7,961,440 B2* | 6/2011 | Gill et al. | 360/324.11 |
| 2003/0123198 A1* | 7/2003 | Sugawara et al. | 360/314 |
| 2003/0151857 A1* | 8/2003 | Kishi | 360/321 |
| 2005/0128651 A1 | 6/2005 | Yi et al. | |
| 2005/0168317 A1 | 8/2005 | Clifton et al. | |
| 2005/0249979 A1* | 11/2005 | Gill | 428/828 |
| 2007/0035888 A1 | 2/2007 | Sbiaa et al. | |
| 2007/0091513 A1 | 4/2007 | Sbiaa et al. | |
| 2007/0230066 A1* | 10/2007 | Gill | 360/324.1 |
| 2007/0253107 A1 | 11/2007 | Mochizuki et al. | |
| 2008/0112087 A1 | 5/2008 | Clinton et al. | |
| 2008/0231994 A1 | 9/2008 | Kimura et al. | |
| 2008/0259498 A1 | 10/2008 | Lengsfield et al. | |
| 2009/0231762 A1* | 9/2009 | Ohta et al. | 360/324.12 |
| 2009/0289207 A1 | 11/2009 | Barreda et al. | |
| 2010/0187120 A1 | 7/2010 | Seets et al. | |
| 2010/0321835 A1 | 12/2010 | Zhang et al. | |

OTHER PUBLICATIONS

The International Search Report and Written Opinion of the International Searching Authority in counterpart foreign application No. PCT/US2010/027510 filed Mar. 16, 2010.

* cited by examiner

*Primary Examiner* — Kevin Bernatz
(74) *Attorney, Agent, or Firm* — Hall Estill Attorneys at Law

(57) ABSTRACT

A magnetic sensor has at least a free sub-stack, a reference sub-stack and a front shield. The free sub-stack has a magnetization direction substantially perpendicular to the planar orientation of the layer and extends to an air bearing surface. The reference sub-stack has a magnetization direction substantially perpendicular to the magnetization direction of the free sub-stack. The reference sub-stack is recessed from the air bearing surface and a front shield is positioned between the reference sub-stack and the air bearing surface.

20 Claims, 14 Drawing Sheets

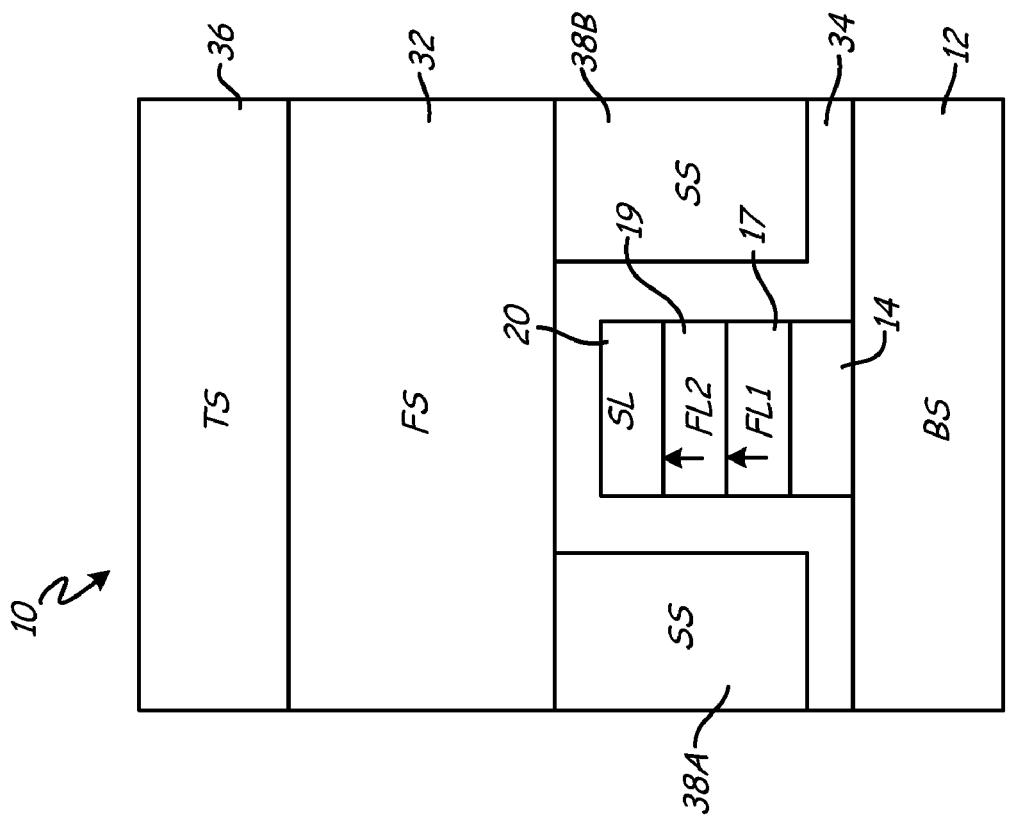
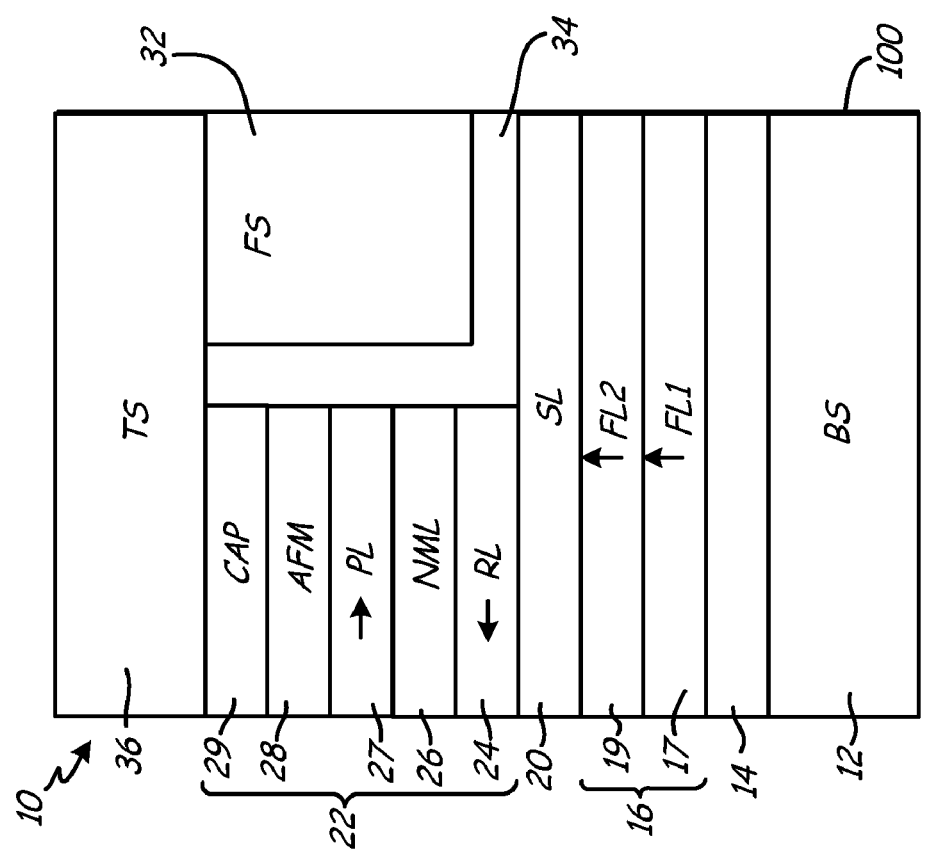

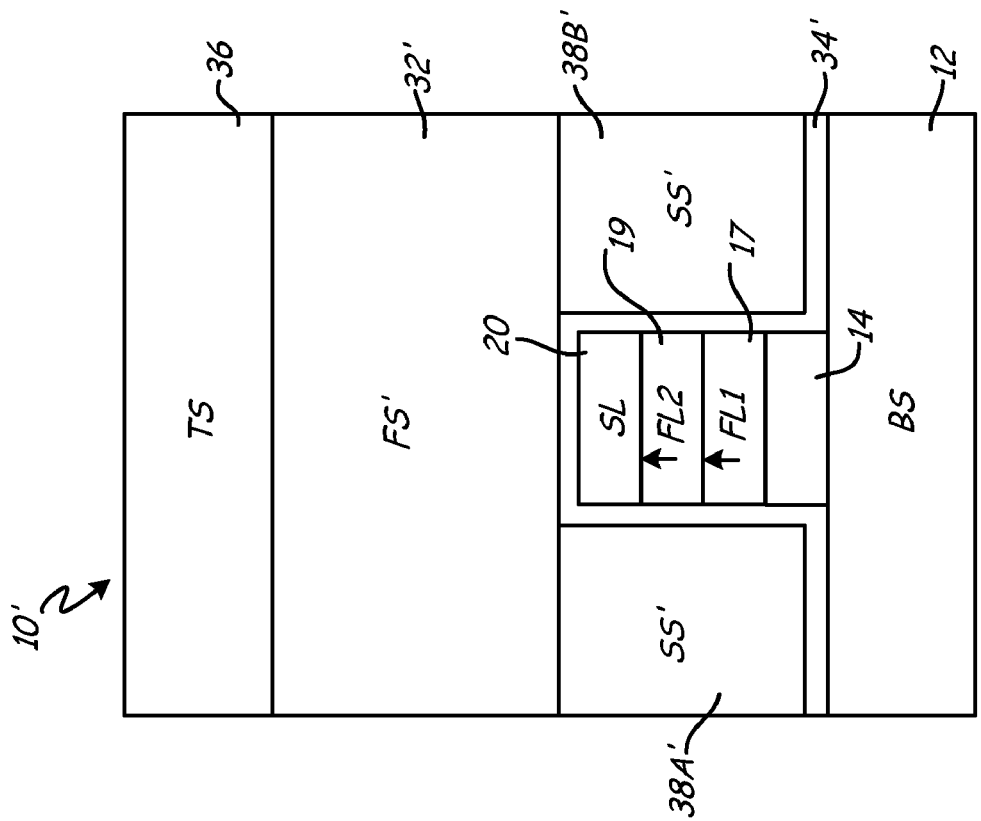
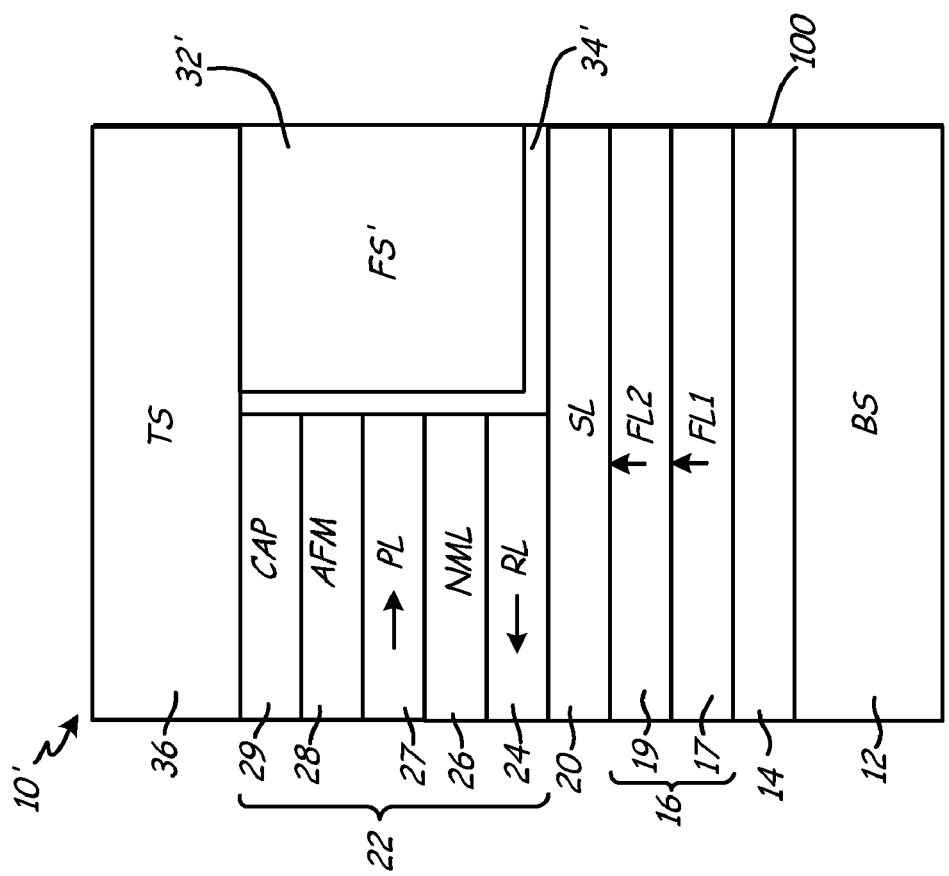

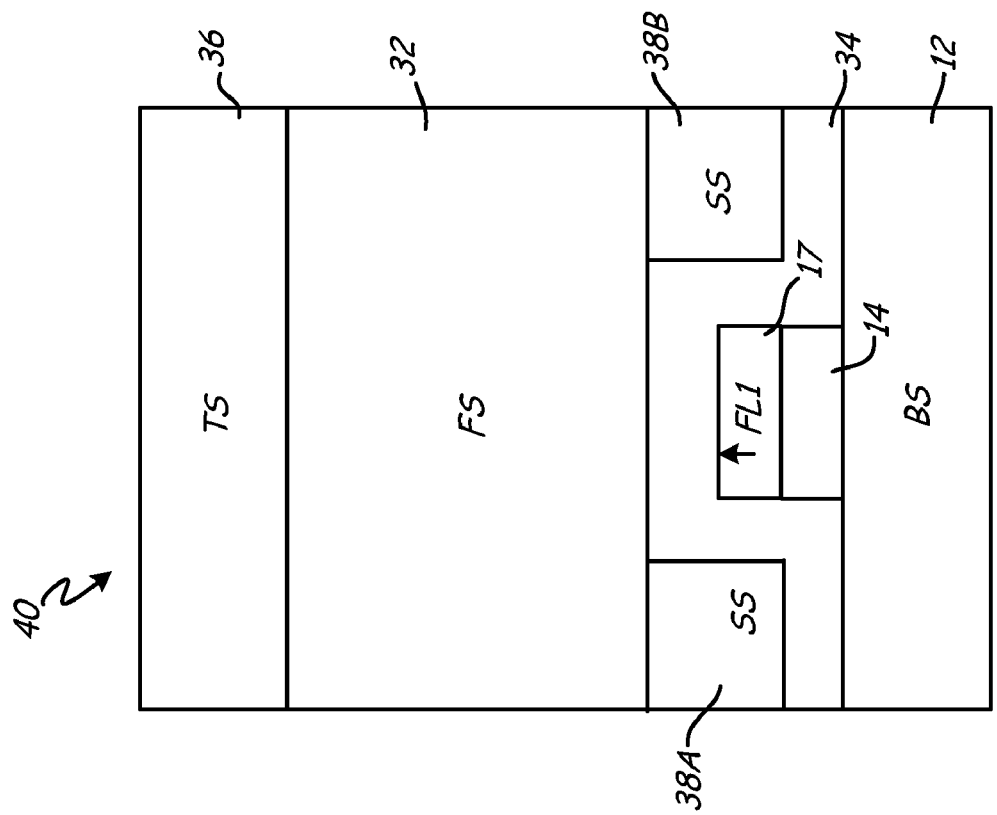
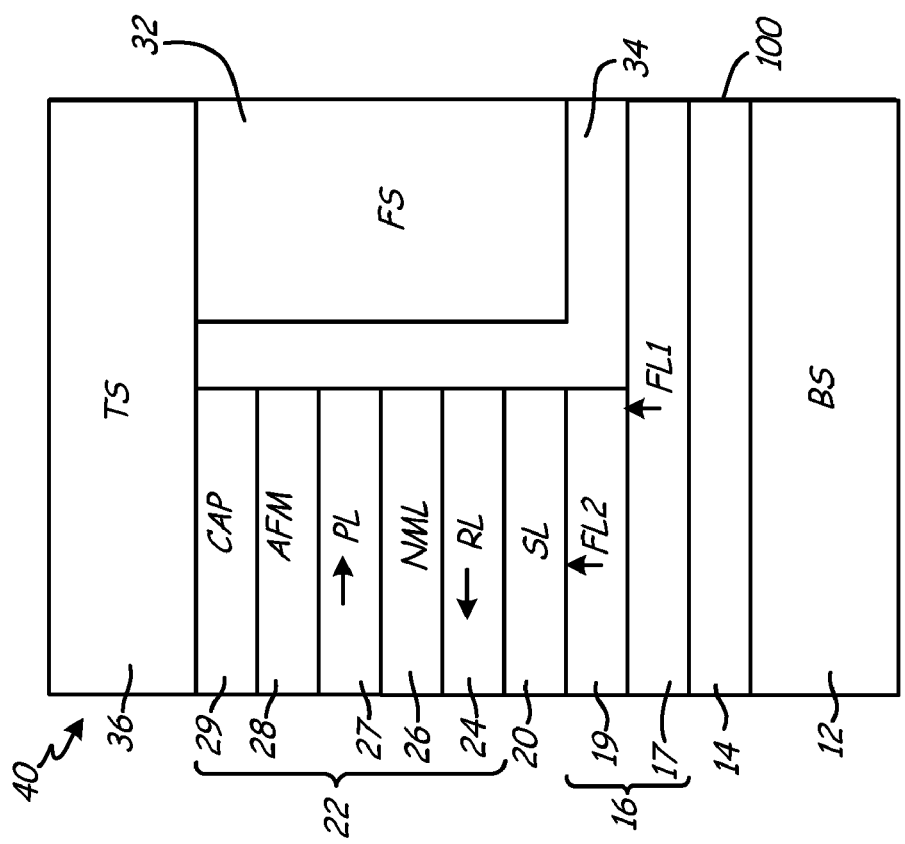
Fig. 3A
Fig. 3B

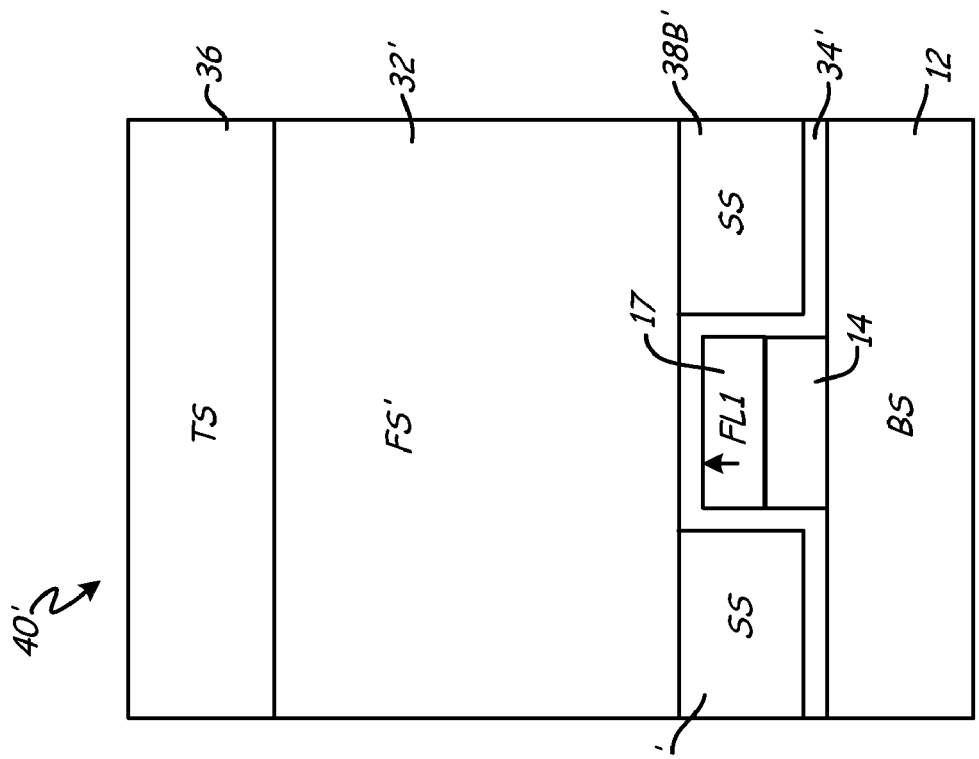
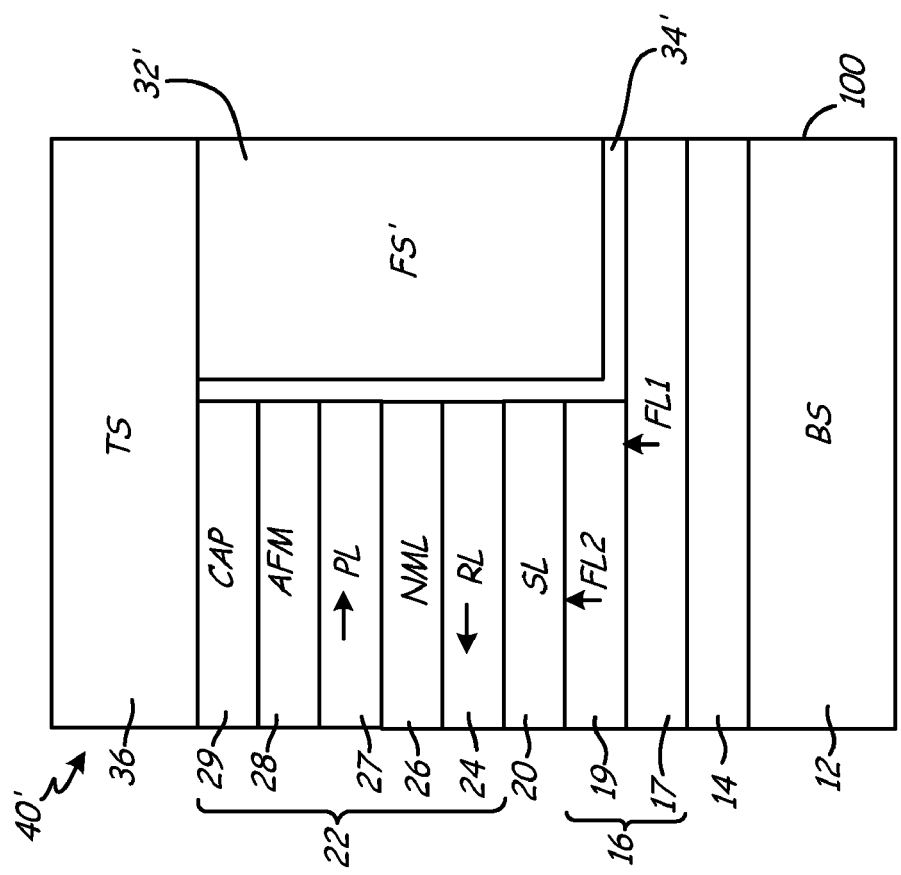

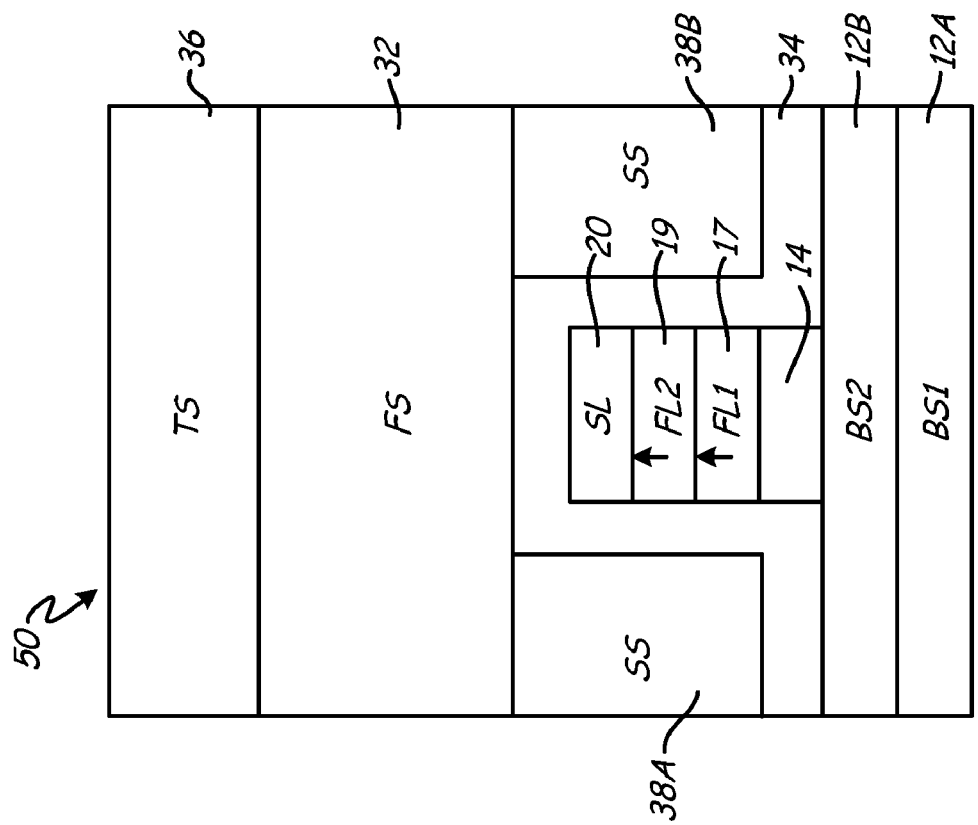
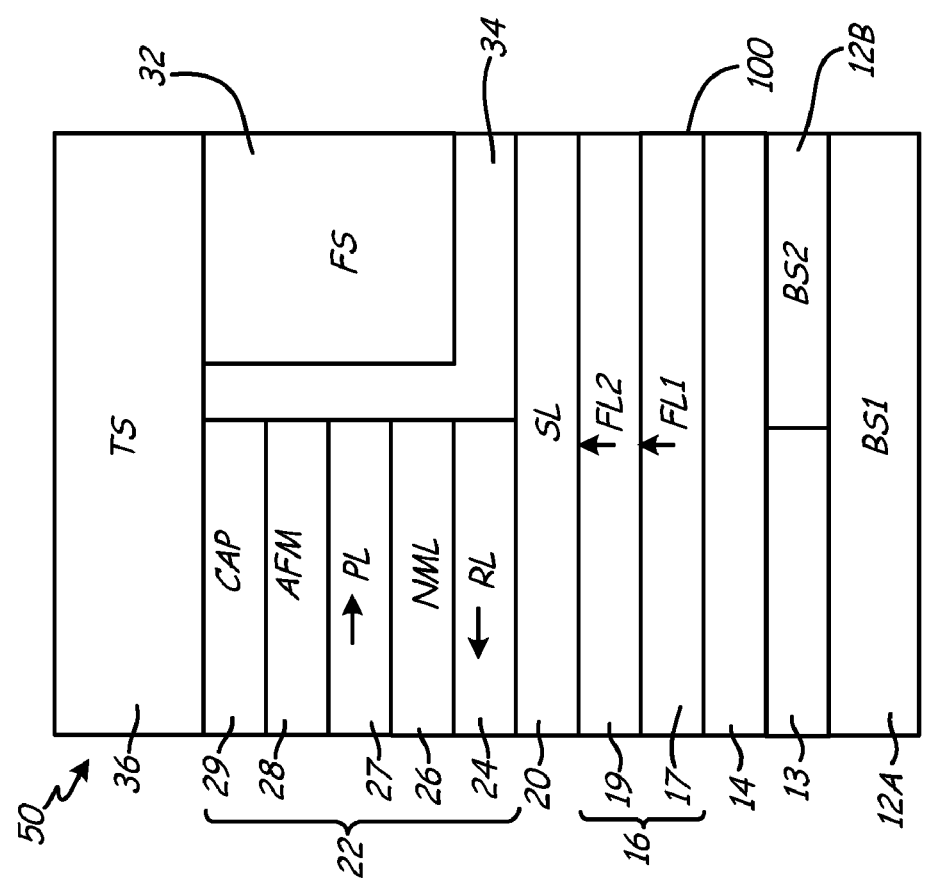
Fig. 5B
Fig. 5A

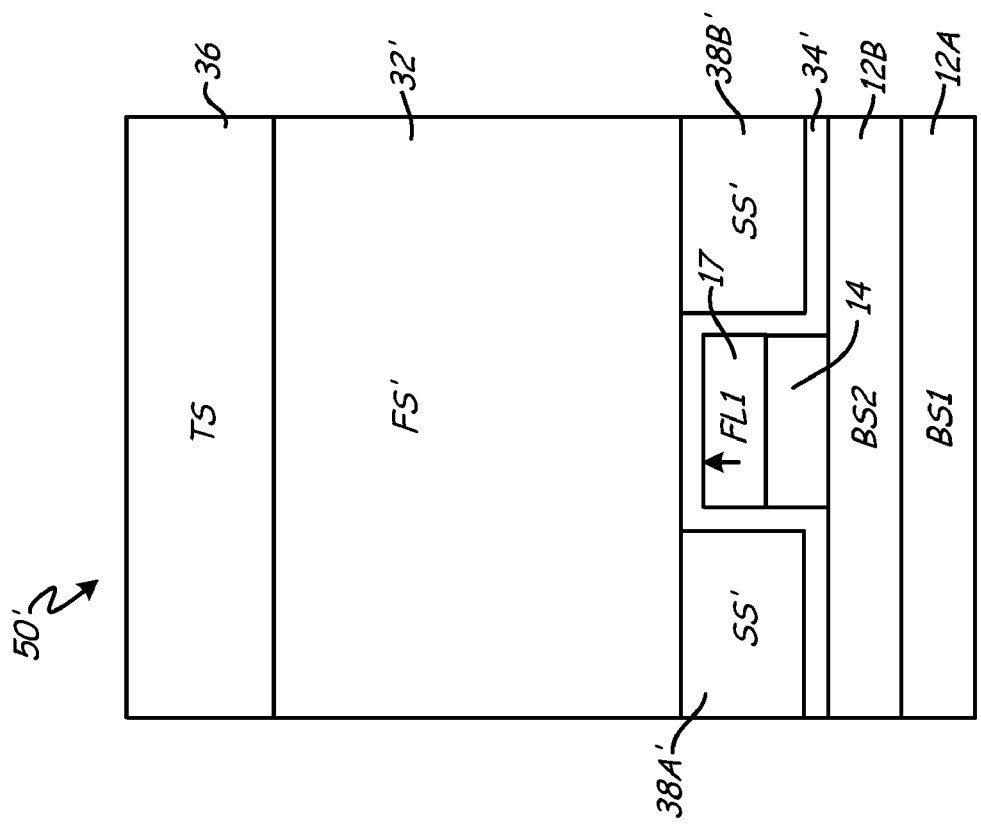
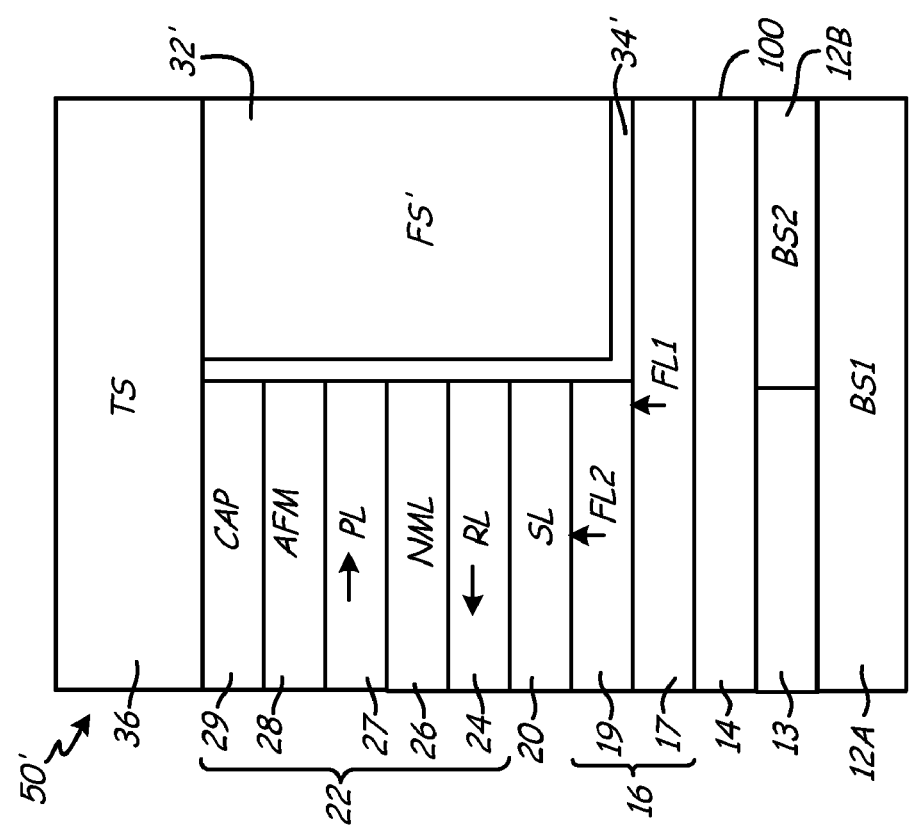

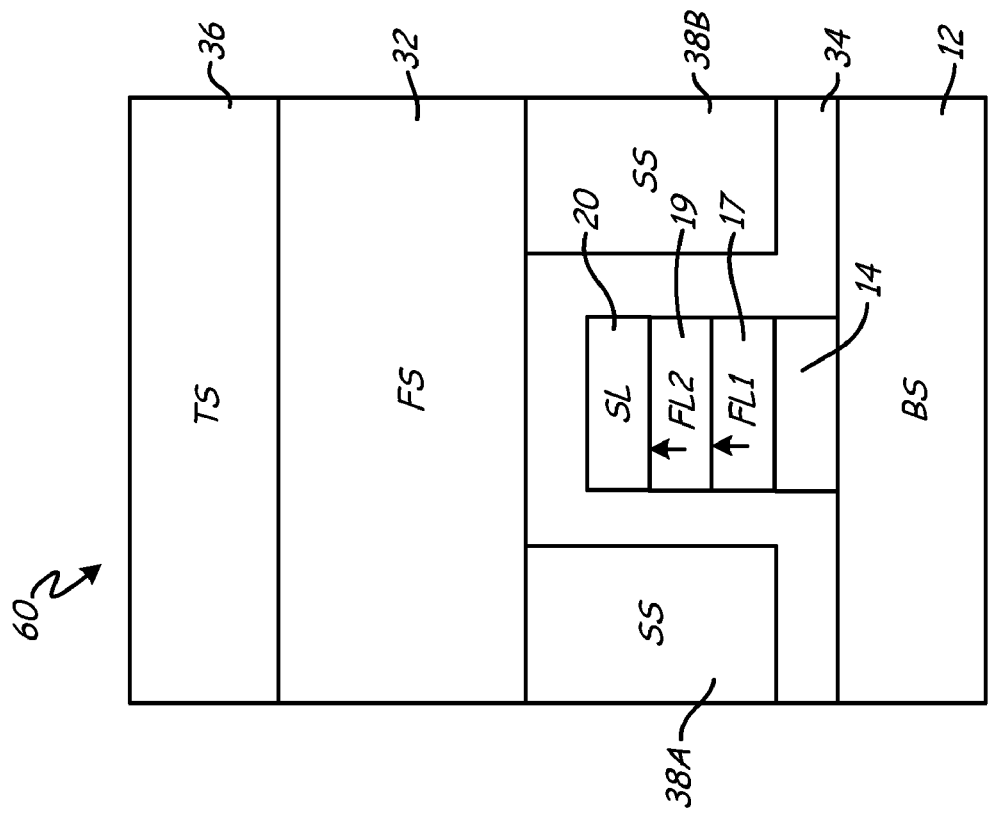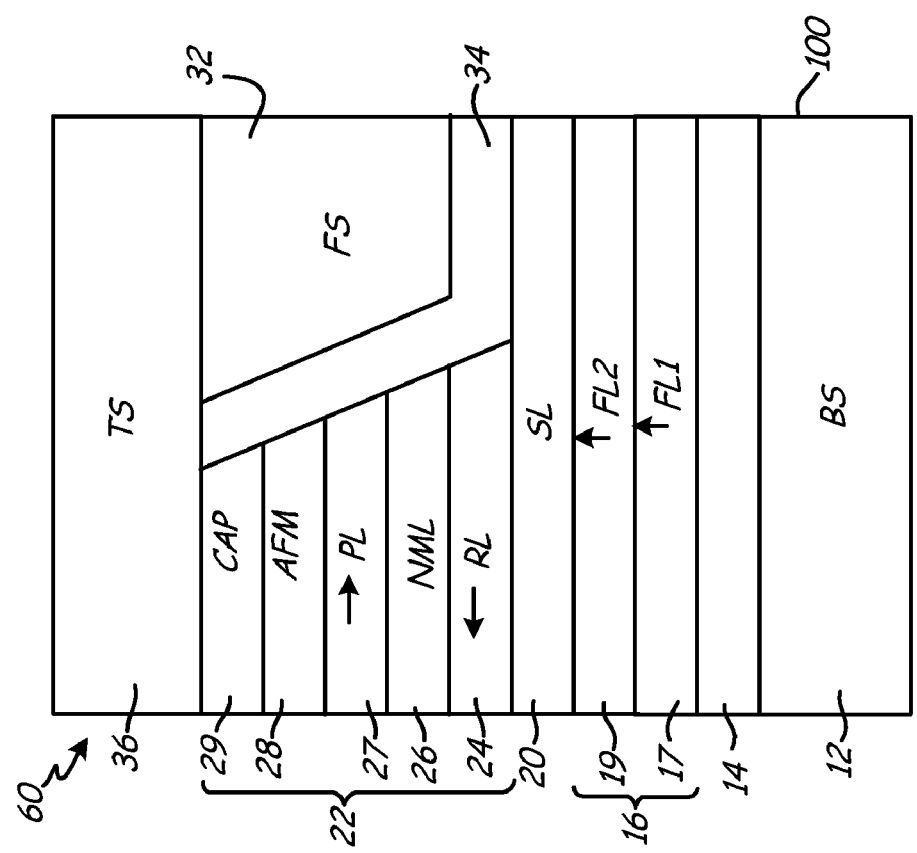

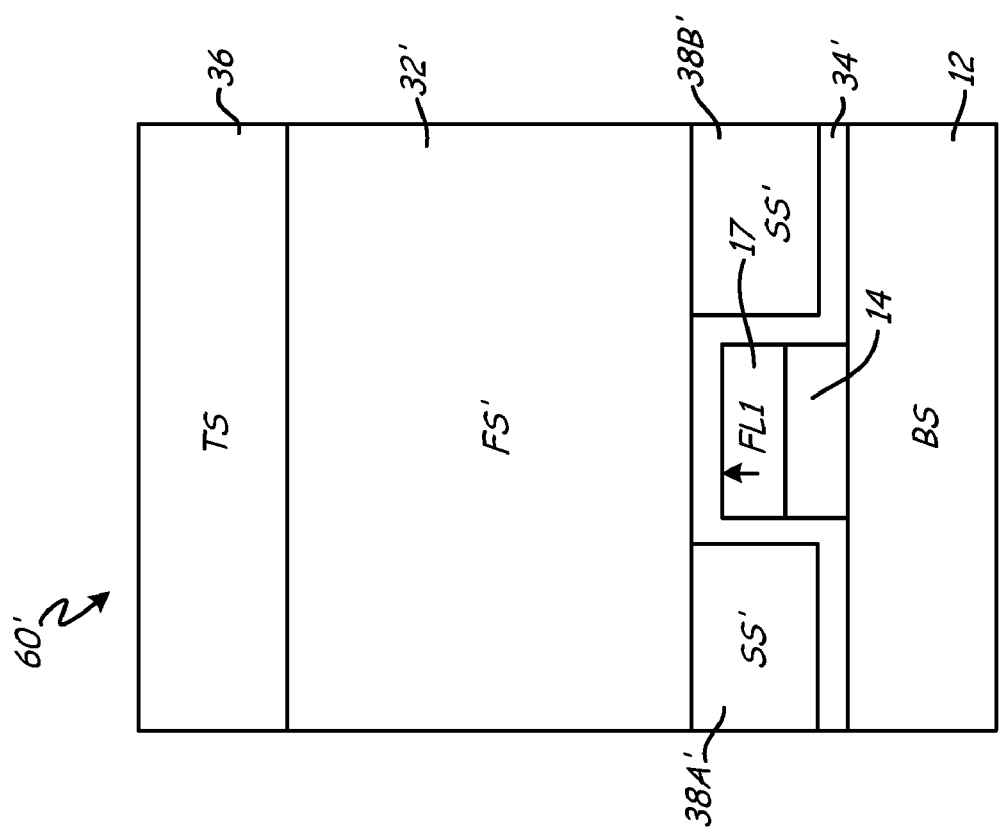
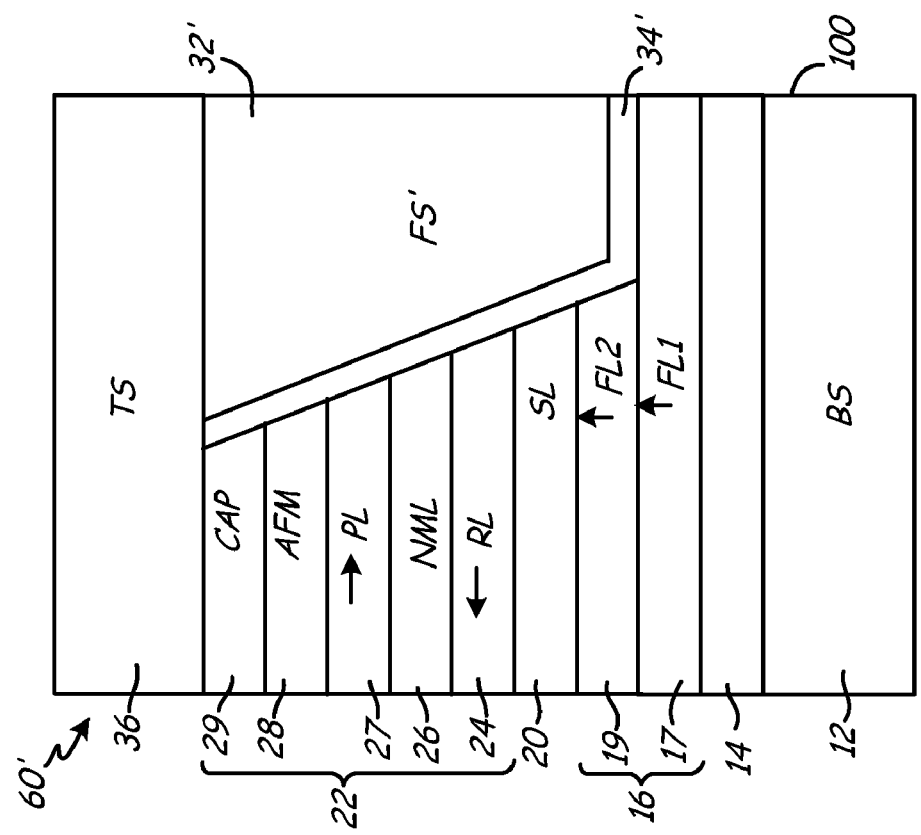

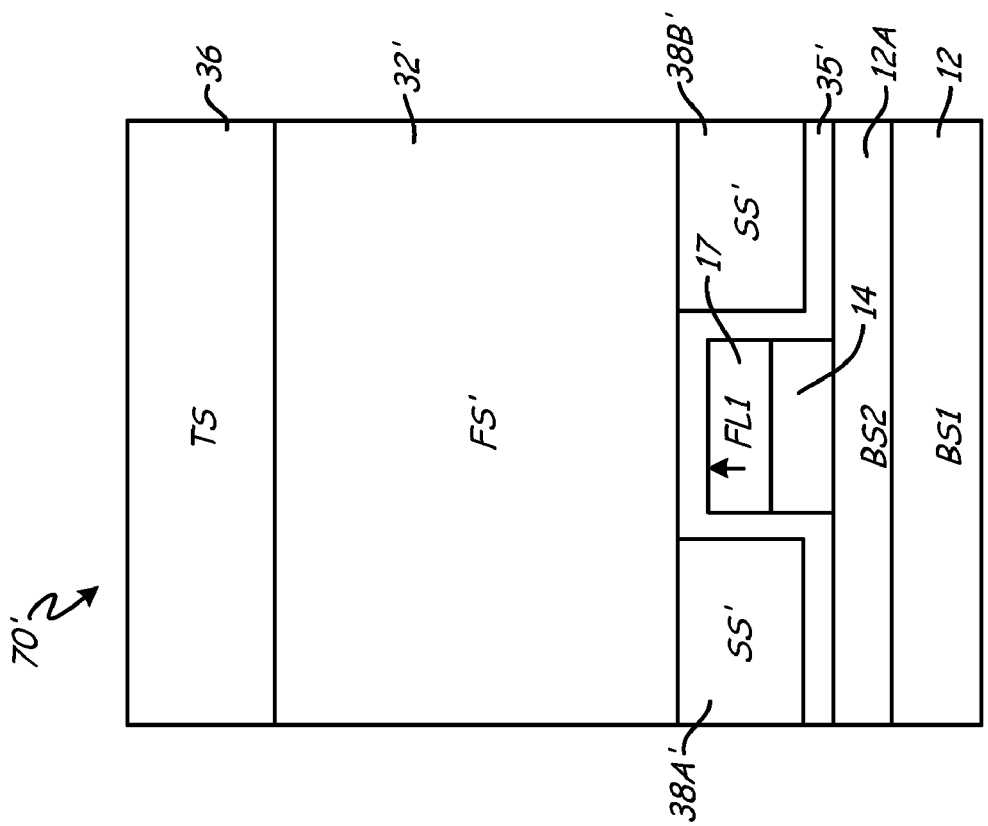
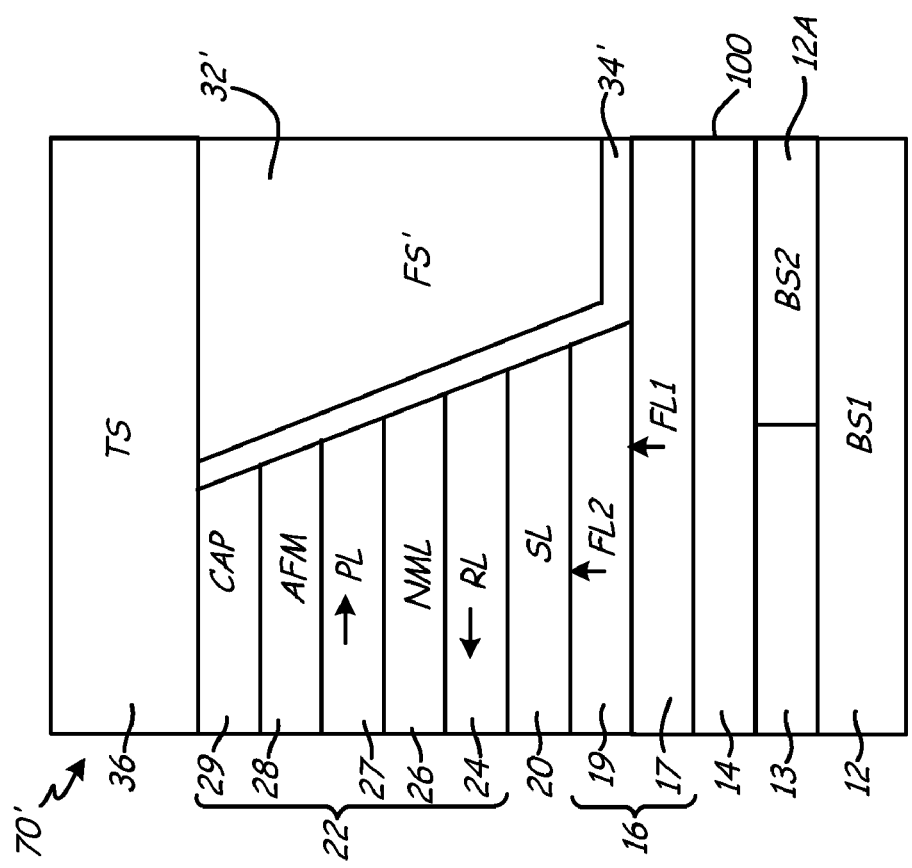
Fig. 10A
Fig. 10B

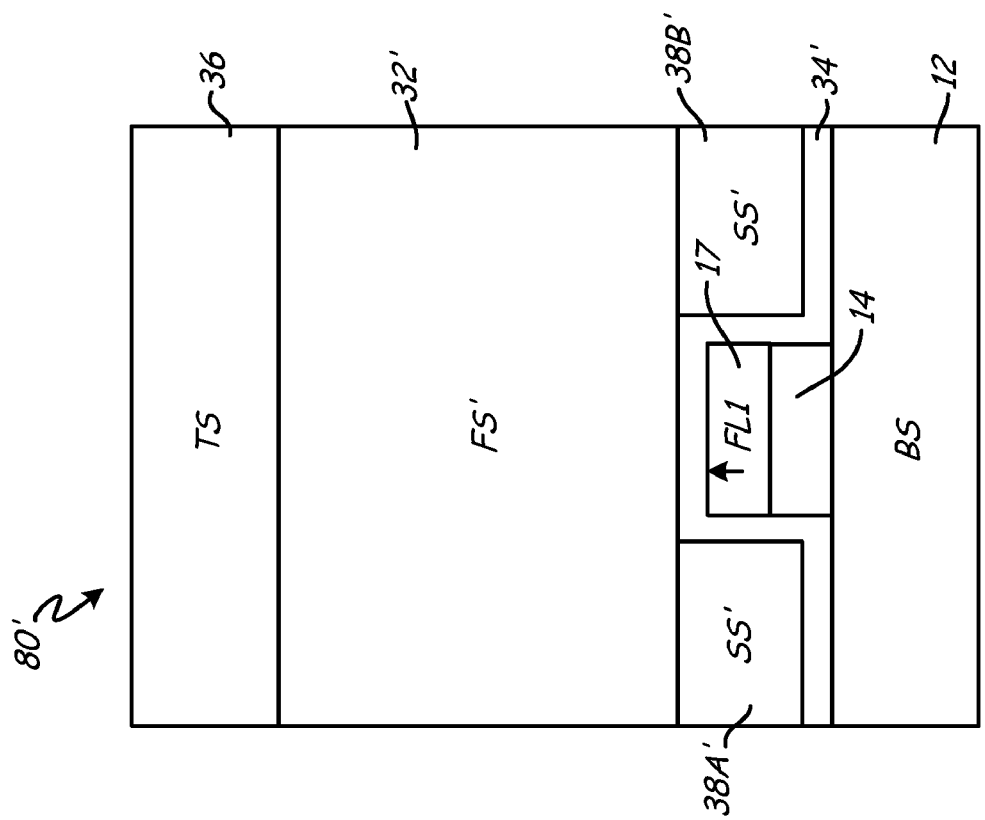
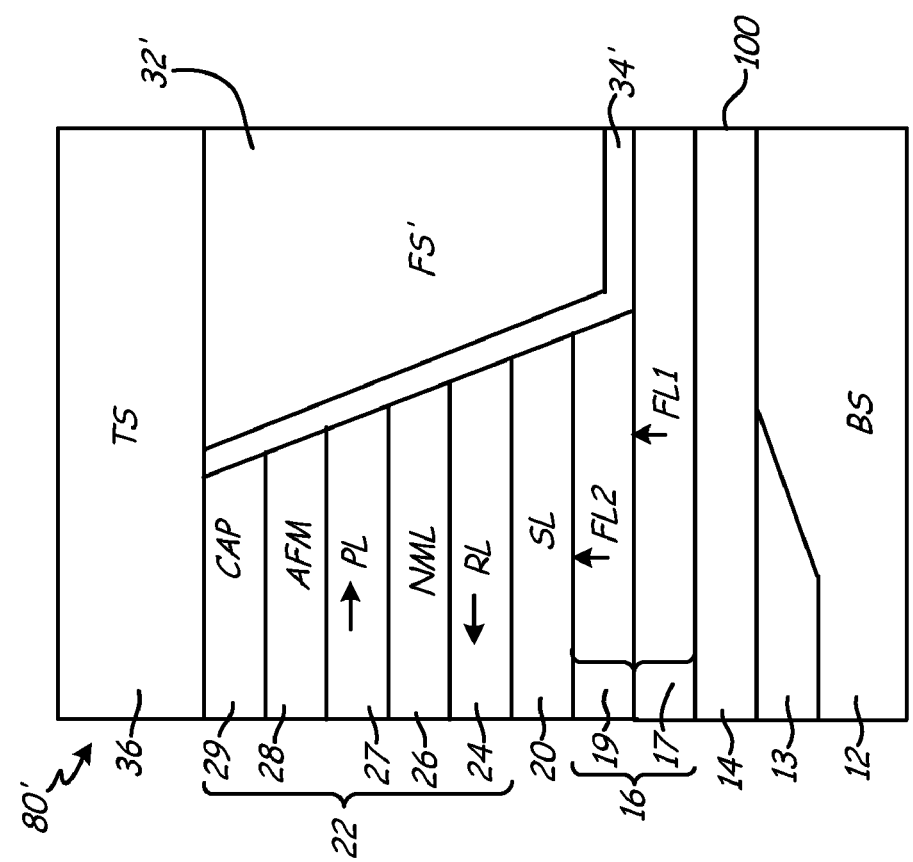

US 8,395,867 B2

MAGNETIC SENSOR WITH A RECESSED REFERENCE LAYER ASSEMBLY AND A FRONT SHIELD

SUMMARY

A magnetic sensor is generally disclosed having a free sub-stack, a reference sub-stack and a front shield. The free sub-stack has a magnetization direction substantially perpendicular to the planar orientation of the layer and extends to an air bearing surface. The reference sub-stack has a magnetization direction substantially perpendicular to the magnetization direction of the free sub-stack and is recessed from the air bearing surface. A front shield is positioned between the reference sub-stack and the air bearing surface.

BRIEF DESCRIPTION OF THE DRAWINGS

FIGS. 1A-12A are cross section views of magnetic sensors having a recessed reference layer, a front shield, and a freelayer with magnetic anisotropy perpendicular to the plane of the layer.

FIGS. 1B-12B are air bearing surface views of the magnetic sensors of FIGS. 1A-12A, respectively.

DETAILED DESCRIPTION

Figure 9B:
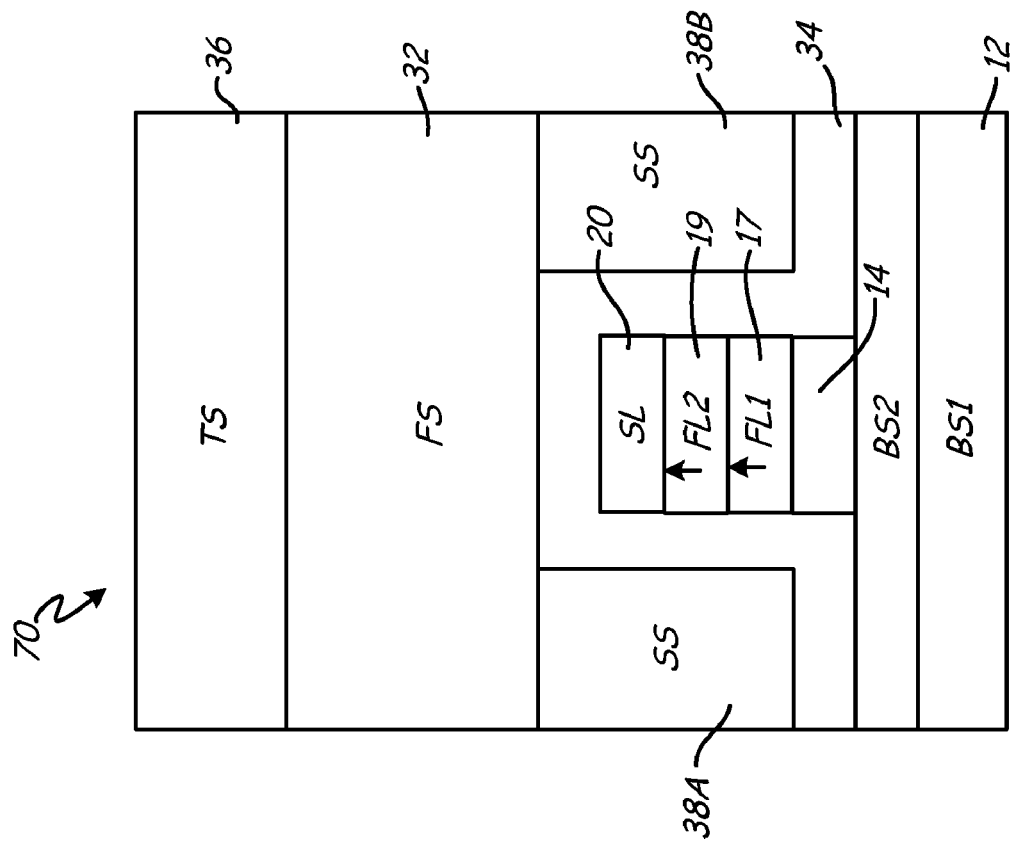

FIG. 1A shows a schematic cross section of an embodiment of a MR sensor 10, which is a current perpendicular to plane (CPP) GMR or TMR sensor stack. MR sensor 10 includes bottom shield 12, seedlayer 14, freelayer assembly 16 (formed by freelayers 17 and 19), spacer layer 20, reference layer assembly 22 (formed by reference layer 24, nonmagnetic layer 26, pinned layer 27, antiferromagnetic layer 28, and cap layer 29), front shield 32, insulator layer 34, and top shield 36. Shields 12 and 36 also act as electrodes for CPP MR sensor 10. During operation in the presence of a bit field from recorded media, the magnetization direction of freelayer assembly 16 will change in relation to the fixed magnetization of reference layer 24 of reference layer assembly 22 and will be detected as a change in electrical resistance (and voltage) between shields 12 and 36.

In the sensor stack, spacer layer 20 separates freelayer assembly 16 and reference layer assembly 22. If spacer layer 20 is a conducting layer, MR sensor 10 is a GMR sensor. If spacer layer 20 is an electrically insulating layer, MR sensor 10 is a TMR sensor. Freelayer assembly 16 comprises first freelayer 17 under second freelayer 19. Second freelayer 19 is separated from reference layer assembly 22 by spacer layer 20. Reference layer assembly 22 is recessed from air bearing surface 100 wherein the space between reference layer assembly 22 and air bearing surface (ABS) 100 is occupied by front shield 32. Front shield 32 is separated from reference layer assembly 22 and spacer layer 20 by insulator layer 34. Top shield 36 is on reference layer assembly 22 and front shield 32. First freelayer 17 is separated from bottom shield 12 by seedlayer 14. Reference layer assembly 22 comprises a synthetic antiferromagnetic stack comprising reference layer 24 and pinning layer 27 separated by nonmagnetic layer 26. Pinning layer 27 is exchange coupled to antiferromagnetic layer 28 which, in turn, is under cap layer 29.

The linear dimension of the down track sensing area of MR sensor 10 is, in this case, defined by the spacing between front shield 32 and bottom shield 12 at MCS 100. This distance is less than the distance between top shield 36 and bottom shield 12 due to the presence of front shield 32.

FIG. 1B shows the air bearing surface view of the MR sensor 10 of FIG. 1A. Side shields 38A and 38B are shown on both sides of the active sensor area containing seed layer 14, first freelayer 17, second freelayer 19 and spacer layer 20. Insulator layer 34 separates side shields 38A and 38B from the active area of the sensor. The track width of MR sensor 10 is defined by the lateral separation of the side shields.

First freelayer 17 exhibits a magnetization direction perpendicular to the planar orientation of the layer and is comprised of, for example, TbFeCo. Other possible materials for freelayer 17 are rare earth transition metal alloys such as GdFe, GdCoFe, TbCo, TbCoFe, or alloys of Co, Fe, Pt and Pd or single or multiple bilayers of Co, Fe, CoCr, CoFe coupled with Pt or Pd, such as (Co/Pt)n where n can be any number. Second freelayer 19 also exhibits magnetization direction perpendicular to the planar orientation of the layer and provides high spin polarization and tunneling magnetoresistance and is comprised of, for example, CoFeB other possible materials for freelayer 19 are Co, Fe, Ni or their alloys or CoX, CoNiX, CoFeX where X=B, Ru, Rh or Pt. The perpendicular magnetization direction of freelayer 19 is enforced by the exchange coupling with the freelayer 17. Top shield 36, front shield 32, bottom shield 12, and side shields 38A and 38B are preferably made of soft magnetic material such as, but not limited to, NiFe, NiCoFe, and CoZrNb. In what follows, all like numbered layers are of identical materials to those named here.

Spacer layer 20 is a nonmagnetic layer disposed between freelayer 19 and reference layer assembly 22. Spacer layer 20 may be a nonmagnetic conductive material such as Cu, Ag, Au, or Ru, making MR sensor 10 a giant magnetoresistive (GMR) sensor. Alternatively, spacer layer 20 may be a nonmagnetic insulator or semiconductor material such as oxides formed of Mg, Al, Hf, or Ti, making MR sensor 10 a tunneling magnetoresistive (TMR) sensor.

The magnetization direction of freelayer assembly 16 is perpendicular to the fixed magnetization direction of reference layer 24 in reference layer assembly 22. Reference layer assembly 22 may be a single ferromagnetic layer having an anisotropy defined magnetization direction. Reference layer assembly 22 may also include various combinations of layers to provide magnetization having a fixed direction such as a ferromagnetic pinned layer with an antiferromagnetic pinning layer, a synthetic antiferromagnetic pinned layer (i.e. two ferromagnetic layers coupled by a nonmagnetic metal such as Ru), or a synthetic ferromagnetic pinned layer coupled to an antiferromagnetic pinning layer. Ferromagnetic layers of reference layer assembly 22 may be made of a ferromagnetic alloy such as CoFe, NiFe, or NiFeCo and the antiferromagnetic layer may be made of PtMn, IrMn, NiMn or FeMn. In what follows, all like numbered layers are of identical materials to those named here.

In operation, a sense current is passed through sensor stack 10 via leads/shields 12 and 36 such that the current passes perpendicular to the plane of the layers of sensor stack 10. The sense current may be a direct current (DC) bias current, an alternating current (AC) bias current, or a current with a combination of DC and AC bias components. As magnetization in freelayer stack 16 rotates in response to external magnetic fields, the resistance of sensor stack 10 changes as a function of the angle between magnetizations in sensor stack 16 and reference layer 24. The voltage across sensor stack 10 is measured between leads/shields 12 and 36 by external circuitry (not shown) to detect changes in resistance to sensor stack 10.

As shown in FIG. 1B, the active area of sensor stack 10 is defined by the area between the front and bottom shields and the side shields which are electrically isolated from the freelayer by insulator layer 34. The shield-to-shield spacing is defined by the distance between bottom shield 12 and front shield 32. In order to provide good electrical insulation, the thickness of insulating layer 34 is preferred to be about 4 to about 8 nm, preferably about 5 nm. The thickness of freelayer assembly 16 is preferred to be about 4 to about 8 nm, preferably about 8 nm. The thickness of seedlayer 14 is preferred to be about 2 to about 5 nm, preferably about 2 nm. The thickness of spacer layer 20 is preferred to be about 1 nm to about 5 nm, preferably 1 nm. Under optimal conditions the shield-to-shield spacing can be about 16 nm for sensor configuration 10.

Free layer assembly 16, in this embodiment, has two layers. In other versions, the free layer assembly can have more than two layers. In a similar fashion, reference layer assembly 22 is shown to have five layers here but could have a different number of layers in other versions.

FIGS. 2A and 2B show a schematic cross section and air bearing surface view of sensor 10', respectively. Sensor 10' is structurally similar to sensor 10 in FIGS. 1A and 1B in that reference layer assembly 22 is recessed from air bearing surface 100 wherein the space between reference layer assembly 22 and air bearing surface 100 is occupied by front shield 32'. Reference layer assembly 22 is separated from freelayer assembly 16 by spacer layer 20. As in sensor 10, seedlayer 14 is under freelayer assembly 16 and the free and reference layer assemblies are between top shield 36, bottom shield 12, and side shields 38A' and 38B'. The shield materials in this sensor configuration are different. Front shield 32' and side shields 38A' and 38B' are made of magnetically soft insulating material such as nickel containing ferrite materials or laminated films. As a result, the requirement for electrical insulation is reduced due to the higher electrical resistivity of the ferrites and other equivalent materials. The role of the insulating material between the sensor stack and shields is mainly to break any magnetic coupling. As a result, the insulating layer can be thinner and can be about 1 nm to about 4 nm, preferably about 1 nm. The shield-to-shield spacing in sensor 10' is about 12 nm compared to the shield-to-shield spacing of about 16 nm in sensor 10.

FIGS. 3A and 3B show a schematic cross section and air bearing surface view of sensor 40, respectively. Sensor 40 is structurally similar to sensor 10 in FIGS. 1A and 1B in that reference layer assembly 22 is recessed from air bearing surface 100 wherein the space between reference layer assembly 22 and air bearing surface 100 is occupied by front shield 32. Reference layer assembly 22 is separated from freelayer assembly 16 by spacer layer 20. As in sensor 10, seedlayer 14 is under freelayer assembly 16 and free and reference layer assemblies 16 and 22 are between top shield 36, bottom shield 12, and side shields 38A and 38B. In comparison to sensor 10, front shield 32 and insulating layer 34 extend toward bottom shield 12 through freelayer 19 such that the magnetic circuit from MCS 100 into sensor 40 is only through freelayer 17 thereby reducing the active sensing area at MCS 100. As shown in the air bearing surface view in FIG. 3B, this has the result of decreasing the shield-to-shield spacing to the thickness of freelayer 17 and seedlayer 14. Since the combined thickness of spacer layer 20 and freelayer 19 can be about 2 nm, the shield-to-shield spacing can be as low as 14 nm in sensor 40.

FIGS. 4A and 4B show a schematic cross section and air bearing surface view of sensor 40', respectively. Sensor 40' is structurally similar to sensor 40 in FIGS. 3A and 3B in that reference layer assembly 22 is recessed from air bearing surface 100 wherein the space between reference layer assembly 22 and air bearing surface 100 is occupied by front shield 32'. Reference layer assembly 22 is separated from freelayer assembly 16 by spacer layer 20. As in sensor 40 seedlayer 14 is under freelayer assembly 16 and the free and reference layer assemblies are between top shield 36, bottom shield 12 and side shields 38A' and 38B'. As in sensor 40, front shield 32' and insulating layer 34' extend toward bottom shield 12 through freelayer 19 such that the magnetic circuit from MCS 100 into sensor 40' is only through freelayer 17 thereby reducing the active sensing area at MCS 100 as shown in the air bearing surface view of FIG. 4B. This has the result of decreasing the shield-to-shield spacing to the thickness of freelayer 17 and seedlayer 14.

The shield materials in sensor 40' are the same as those in sensor 10'. Front shield 32', bottom shield 12 and side shields 38A' and 38B' are made of magnetically soft insulating material such as nickel containing ferrite materials or laminated films. As a result, the requirement for electrical insulation is reduced due to the higher electrical resistivity of the ferrites and other equivalent materials. The role of the insulating materials between the sensor stack and shields is mainly to break any magnetic coupling. As a result, the insulating layer can be thinner and can be about 1 nm to about 4 nm, preferably about 1 nm. Since the combined thickness of spacer layer 20 and freelayer 19 can be about 2 nm the shield-to-shield spacing can be as low as about 10 nm in sensor 40'.

FIGS. 5A and 5B show a schematic cross section and air bearing surface view of sensor 50, respectively. Sensor 50 is structurally similar to sensor 10 in FIGS. 1A and 1B in that reference layer assembly 22 is recessed from air bearing surface 100 wherein the space between reference layer assembly 22 and air bearing surface 100 is occupied by front shield 32. Reference layer assembly 22 is separated from freelayer assembly 16 by spacer layer 20. Seedlayer 14 is under freelayer assembly 16, and freelayer and reference layer assemblies 16 and 22 are between top shield 36, bottom shields 12A, 12B and side shields 38A and 38B. Sensor 50 is distinguished from sensor 10 in that an additional shield layer 12B is deposited on bottom shield 12A and extends away from air bearing surface 100 until it stops and is replaced by insulating layer 13 distal from air bearing surface 100. The purpose of insulating layer 13 is to restrict the electrical conduction path between top shield 36 and bottom shield 12 such that the current in the vicinity of MCS 100 is enhanced where magnetization rotation due to the bit fields from the media transitions are larger. In doing so, the increased current will increase signal amplitude from sensor 50. The shield-to-shield spacing of sensor 50 is defined in this case as the distance between additional shield layer 12B and front shield 32 which is the same as sensor 10 in FIGS. 1A and 1B, namely about 16 nm.

FIGS. 6A and 6B show a schematic cross section and air bearing surface view of sensor 50', respectively. Sensor 50' is structurally similar to sensor 40' in FIGS. 4A and 4B in that reference layer assembly 22 is recessed from air bearing surface 100 wherein the space between reference layer assembly 22 and air bearing surface 100 is occupied by front shield 32'. Reference layer assembly 22 is separated from freelayer assembly 16 by spacer layer 20. As in sensor 40', seedlayer 14 is under freelayer assembly 16 and freelayer and reference layer assemblies 16 and 22 are between top shield 36, bottom shields 12A, 12B, and side shields 38A' and 38B'.

Front shield 32' and insulating layer 34' extend toward bottom shield 12 through spacer layer 20 and freelayer 19 such that the shield-to-shield spacing extends from bottom shield 12B to front shield 33 and is on the order of 10 nm. As in sensor 50', bottom shield 12A has additional shield layer 12B extending back from MCS 100 until it confronts insulating layer 13. The purpose of insulating layer 13 is to restrict the electrical conduction path between top shield 36 and bottom shield 12B such that the current in the vicinity of MCS 100 is enhanced where magnetization rotation due to bit fields from the media transitions are larger. In doing so, the increased current will increase signal amplitude from sensor 50'.

The shield materials in sensor 50' are the same as those in sensor 40' in FIGS. 4A and 4B. Front shield 32', bottom shields 12A and 12B and side shields 38A' and 38B' are made of magnetically soft insulating material such as nickel containing ferrite materials or laminated films. As a result, the requirement for electrical insulation is reduced due to the higher electrical resistivity of the ferrites and other equivalent materials. The role of the insulating materials between the sensor stack and shields is mainly to break any magnetic coupling. As a result, the insulating layer can be thinner and can be about 1 nm to about 4 nm, preferably about 1 nm. Since the combined thickness of spacer layer 20 and freelayer 19 can be about 2 nm the shield-to-shield spacing can be as low as about 10 nm in sensor 51.

FIGS. 7A and 7B show a schematic cross section and air bearing surface view of sensor 60, respectively. Sensor 60 is structurally similar to sensor 10 in FIGS. 1A and 1B in that reference layer assembly 22 is recessed from air bearing surface 100 wherein the space between reference layer assembly 22 and air bearing surface 100 is occupied by front shield 32. Reference layer assembly 22 is separated from freelayer assembly 16 by spacer layer 20. As in sensor 10, seedlayer 14 is under freelayer assembly 16 and freelayer and reference layer assemblies 16 and 22 are between top shield 36, bottom shield 12 and side shields 38A and 38B. The structure of sensor 60 is distinct from the structure of sensor 10 in that the back edge of front shield 32 is not vertical but is sloped which allows for gradual opening of the front shield into the sensor. As a result, the bit flux from the media can propagate further into the freelayer and, in doing so, increase reader efficiency and output signal. All materials used in sensor 60 are identical to those in sensor 10. As a result, the shield-to-shield spacing of sensor 60 is approximately equal to the shield-to-shield spacing in sensor 10 or 16 nm.

FIGS. 8A and 8B show a schematic cross section and air bearing surface view of sensor 60', respectively. Sensor 60' is structurally similar to sensor 40' in FIGS. 4A and 4B in that reference layer assembly 22 is recessed from air bearing surface 100 wherein the space between reference layer assembly 22 and air bearing surface 100 is occupied by front shield 32'. Reference layer assembly 22 is separated from freelayer assembly 16 by spacer layer 20. As in sensor 40', seedlayer 14 is under freelayer assembly 16, and freelayer and reference layer assemblies 16 and 22 are between top shield 36, bottom shield 12 and side shields 38A' and 38B'.

The shield materials in this sensor configuration are different from the shield materials in sensor 60. Front shield 33 and side shields 40 and 41 are made of magnetically soft insulating material such as nickel containing ferrite materials or laminated films. As a result, the requirement for electrical insulation is reduced due to the higher electrical resistivity of the ferrites and other equivalent materials. The role of the insulating material between the sensor stack and shields is mainly to break any magnetic coupling. As a result, the insulating layer can be thinner and can be about 1 nm to about 4 nm, preferably about 1 nm. The structure of sensor 60' is similar to the structure of sensor 60, shown in FIG. 7A in that the front edge of the reference structure is not vertical, but is sloped which allows for gradual opening of the front shield into the sensor. In so doing, the magnetic flux from the bit fields on the media propagate further into the freelayer and, by doing so, increase the reader efficiency and output signal. In a fashion similar to sensor 40', in FIG. 4A front shield 32' and insulating layer 34' extend toward bottom shield 12 through spacer layer 20 and freelayer 19 to freelayer 17 such that the magnetic circuit from MCS 100 into sensor 60' is only through freelayer 17 thereby reducing the active sensing area at MCS 100 as shown in the air bearing surface view of FIG. 8B. The shield-to-shield spacing of sensor 60' is similar to the shield-to-shield spacing of 40', namely about 10 nm.

Figure 9A:
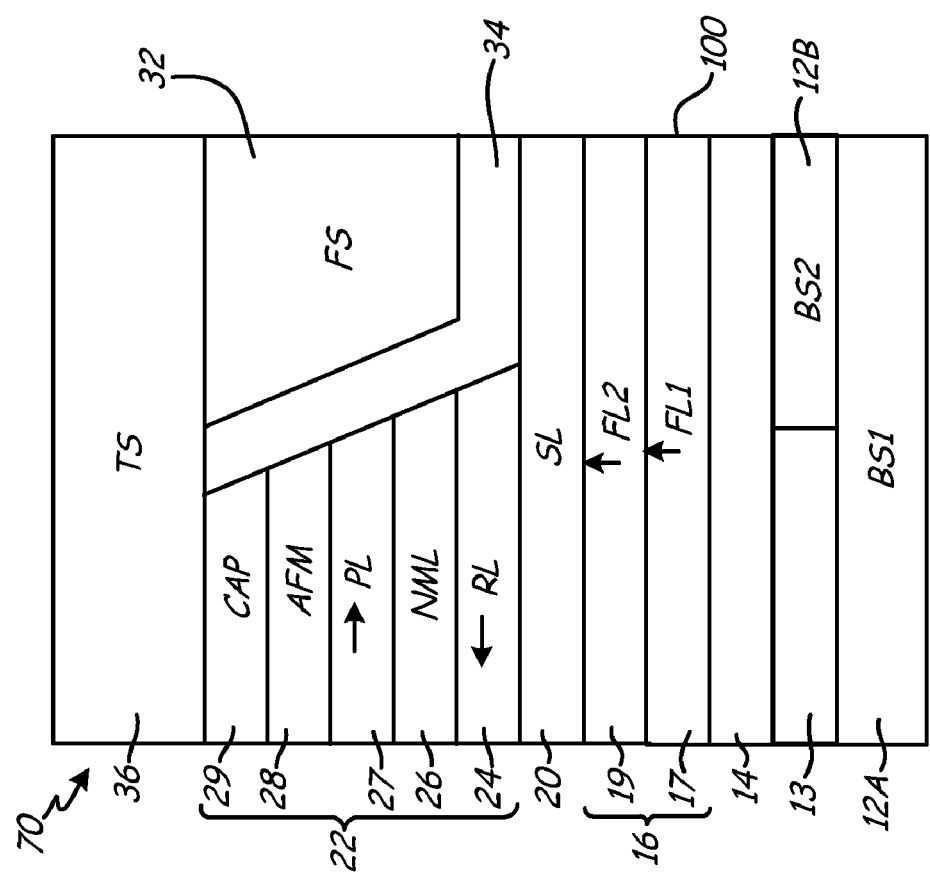

FIGS. 9A and 9B show a schematic cross section and air bearing surface view of sensor 70 respectively. Sensor 70 is structurally similar to sensor 60 in FIGS. 7A and 7B in that reference layer assembly 22 is recessed from air bearing surface 100 wherein the space between reference layer assembly 22 and air bearing surface 100 is occupied by front shield 32. Reference layer assembly 22 is separated from freelayer assembly 16 by spacer layer 20. As in sensor 60 in FIG. 7A, seedlayer 14 is under freelayer assembly 16 and the free and reference layer assemblies are between top shield 36, bottom shield 12 and side shields 38A and 38B. As in sensor 60, sensor 70 has an additional shield layer 12B on shield layer 12A extending away from MCS 100 until it abuts insulating layer 13. A distinguishing feature of sensor 70 is that the front edge of the reference structure is not vertical but is sloped which allows for a gradual opening of the front shield into the sensor away from air bearing surface 100. By doing so, the magnetic bit flux from the media transitions propagates further into the freelayer and increases the reader efficiency and output signal. The shield-to-shield spacing of sensor 70 is similar to the shield-to-shield spacing of sensor 10 and is about 10 nm.

FIGS. 10A and 10B show a schematic cross section and air bearing surface view of sensor 70', respectively. Sensor 70' is structurally similar to sensor 60' in FIGS. 8A and 8B in that reference layer assembly 22 is recessed from media confronting wherein the space between reference layer assembly 22 and air bearing surface 100 is occupied by front shield 32'. Reference layer assembly 22 is separated from freelayer assembly 16 by spacer layer 20. Seedlayer 14 is under freelayer assembly 16, and freelayer and reference layer assemblies 16 and 22 are between top shield 36, bottom shields 12A and 12B and side shields 38A' and 38B'. As in sensor 60', the front edge of the reference structure is not vertical but is sloped which allows for gradual opening of the front shield into the sensor. In doing so, the magnetic flux from the bit fields on the media propagate further into the freelayer and increase the reader efficiency and output signal. In addition, front shield 32' and insulating layer 34' extend toward bottom shield 12A through spacer layer 20 and freelayer 19 to freelayer 17 such that the magnetic circuit from air bearing surface 100 into sensor 70' is only through freelayer 17 thereby reducing the active sensing area at MCS 100 as shown in the air bearing surface view of FIG. 10B.

The shield materials in sensor 70' are the same as those in sensor 10' in FIGS. 2A and 2B. Front shield 32', bottom shields 12A and 12B and side shields 38A' and 38B' are made of magnetically soft insulating material such as nickel containing ferrite materials or laminated films. As a result, the requirement for electrical insulation is reduced due to the higher electrical resistivity of the ferrites and other equivalent materials. The role of the insulating materials between the sensor stack and shield is mainly to break any magnetic coupling. As a result, the insulating layer can be thinner and can be about 1 nm to about 4 nm, preferably about 1 nm. Since the combined thickness of spacer layer 20 and freelayer 19 can be about 2 nm, the shield-to-shield spacing can be as low as about 10 nm in sensor 70'. As in sensor 70 in FIG. 9A, sensor 70' has an additional shield layer 12A on shield layer 12A extending away from MCS 100 until it abuts insulating layer 13. The purpose of insulating layer 13 is to restrict the electrical conduction path between top shield 36 and bottom shields 12A and 12B such that the current in the vicinity of MCS 100 is enhanced whereas the magnetization rotation due to the bit fields from the media transitions are larger. In doing so, the increased current will increase the signal output from sensor 70'.

Figure 11B:
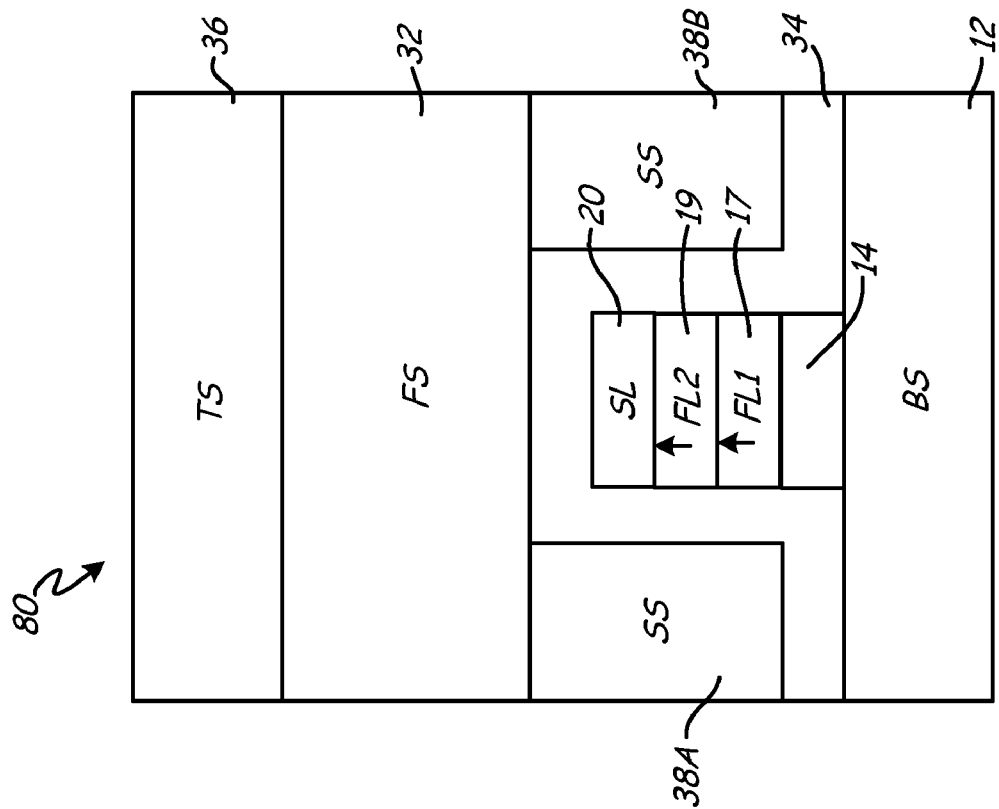
Figure 11A:
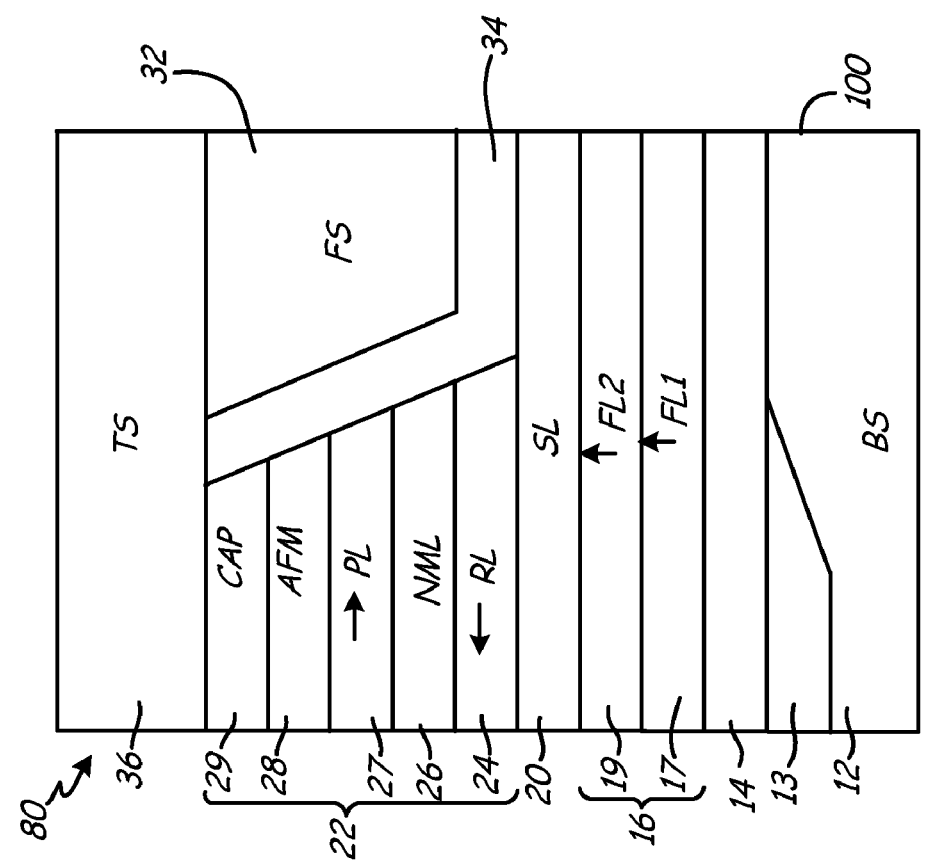

FIGS. 11A and 11B show a schematic cross section and air bearing surface view of sensor 80, respectively. Sensor 80 is structurally similar to sensor 70 in FIGS. 9A and 9B in that reference layer assembly 22 is recessed from air bearing surface 100 wherein the space between reference layer assembly 22 and air bearing surface 100 is occupied by front shield 32. Reference layer assembly 22 is separated from freelayer assembly 16 by spacer layer 20. As in sensor 70, seedlayer 14 is under freelayer assembly 16 and the free and reference layer assemblies are between top shield 36, bottom shield 12 and side shields 38A and 38B. As in sensor 70, the front edge of the reference layer is not vertical but is sloped which allows for a gradual opening of the front shield into the sensor away from the air bearing surface. In doing so, the bit flux from the media transitions propagates further into the freelayer and increases the reader efficiency and output signal. In contrast to sensor 70 wherein shield layer 12B and insulator 13 were on shield layer 12A and wherein insulator layer 13 abutted shield layer 12B distal from air bearing surface 100, bottom shield layer 12 is a single layer that gradually decreases in thickness distal from MCS 100 and is replaced by insulator layer 13. The purpose of insulating layer 13 is to restrict the electrical conduction path between top shield 36 and bottom shields 12A and 12B such that the current in the vicinity of MCS 100 is enhanced so that the magnetization rotation due to the bit fields from the media transitions are larger. In doing so, the increased current will increase the signal output from sensor 70'. The gradual sloping of bottom shield layer 12 away from air bearing surface 100 assists in concentrating the field and the magnetic circuit in freelayer assembly 16 in response to bit flux from transitions written on the media. The shield-to-shield spacing of sensor 80 is similar to the shield-to-shield spacing of sensor 10 in FIGS. 1A and 1B, namely about 16 nm.

FIGS. 12A and 12B which show a schematic cross section and air bearing surface view of sensor 80', respectively. Sensor 80' is structurally similar to sensor 80 in FIGS. 11A and 11B in that reference layer assembly 22 is recessed from air bearing surface 100 wherein the space between reference layer assembly 22 and air bearing surface 100 is occupied by front shield 32'. Reference layer assembly 22 is separated from freelayer assembly 16 by spacer layer 20. As in sensor 80, seedlayer 14 is under freelayer assembly 16 and the free and reference layer assemblies are between top shield 36, bottom shield 12 and side shields 38A' and 38B'. As in sensor 80, the front edge of the reference structure is not vertical but is sloped which allows for a gradual opening of the front shield into the sensor away from the air bearing surface. By doing so the magnetic bit flux from the media transitions propagates further into the freelayer and increases the reader efficiency and output signal. The shield-to-shield spacing of sensor 80' is similar to the shield-to-shield spacing of sensor 70' in FIGS. 10A and 10B and is about 10 nm. Bottom shield 12 in sensor 81 is a single layer that starts to decrease in thickness at a point distal from MCS 100 wherein the decreased thickness is replaced by insulating layer 13. The purpose of insulating layer 13 is to restrict the electrical conduction path between top shield 36 and bottom shield 12B such that the current in the vicinity of MCS 100 is enhanced where the magnetization rotation due to the bit fields from the media transitions are larger. In doing so, the increased current will increase signal amplitude from sensor 70. The sloped contour of bottom shield 12 away from air bearing surface 100 aids in magnetic circuit flow through freelayers 17 and 19 enhancing signal output of sensor 8D'.

Figure 13A:
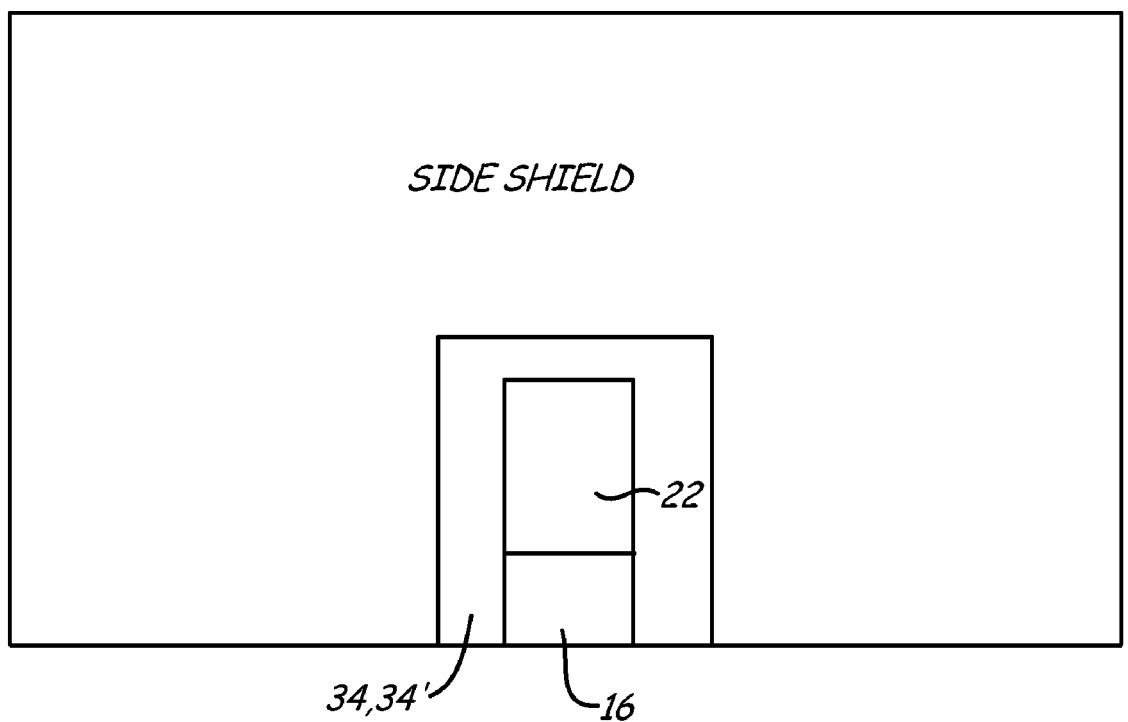
FIG. 13A is a top view of a magnetic sensor showing the geometrical relationship of the side shield to the freelayer and reference layer assemblies.
Figure 13B:
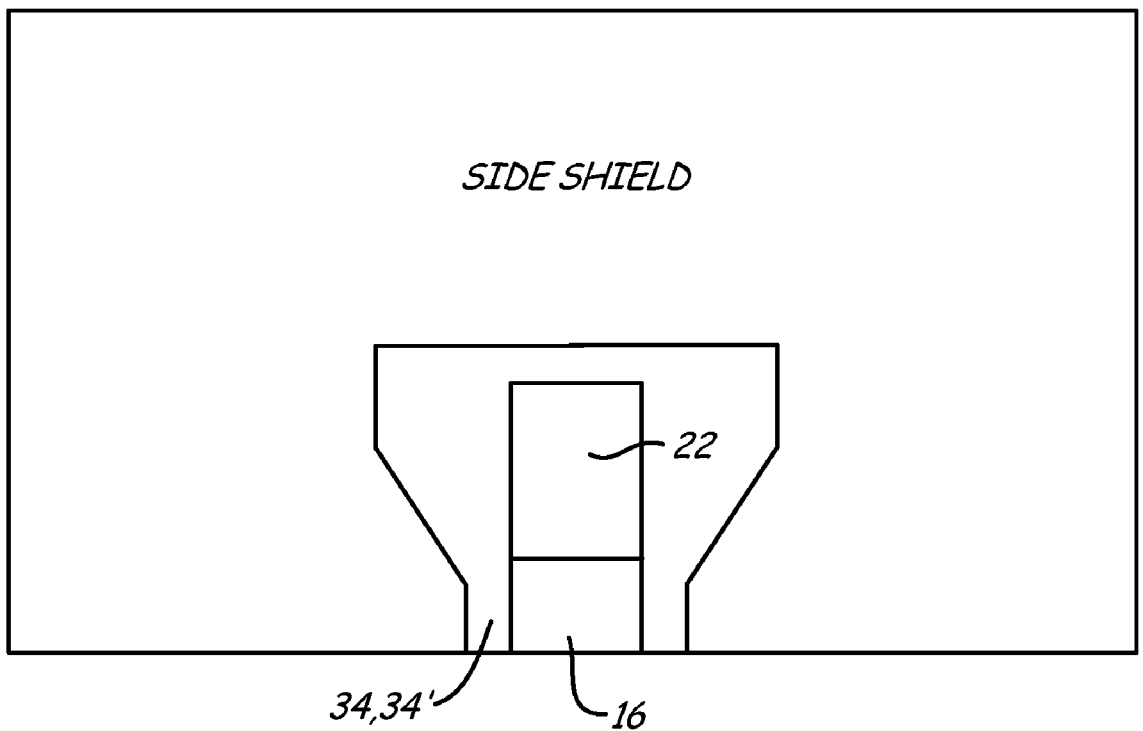
FIG. 13B is a top view of a magnetic sensor showing another aspect of the geometrical relationship of the side shield to the sensor stack.

FIG. 13A is a top view of the example magnetic sensor layout showing the geometrical relation between the side shield and the sensor stack. The sides of the side shield, in this case, are straight and are parallel to the sides of reference layer assembly 22 and freelayer assembly 16. This geometry is preferred from the standpoint of manufacturability. An enhanced geometry from the standpoint of performance is shown in FIG. 13B wherein the thickness of insulating layers 34 and 34' in the vicinity of reference layer assembly 22 is increased. This has enhanced performance by allowing easier flux penetration from the media transitions and resulting improved reader efficiency.

In summary, a number of configurations of a CPP magnetic sensor comprising a freelayer assembly, a reference layer assembly, top, bottom, side and front shields are described. Magnetization orientation of the freelayers is substantially perpendicular to the planar orientation of the layers. A distinguishing characteristic of the reader designs is that a front shield is positioned between the reference layer assembly and the air bearing surface thereby reducing shield-to-shield spacing and increasing areal density of the reader. Configurations are described that enhance media flux flow into the reader and electrical current flow proximate the air bearing surface of the magnetic sensor.

In other configurations, the relative positions of freelayer assembly 16 and reference layer assembly 22 may be reversed, so that reference layer assembly 22 is closer to bottom shield 12. In that case, front shield 32 may be positioned adjacent bottom shield 12 rather than top shield 36.

Although the present disclosure has been described with reference to preferred embodiments, workers skilled in the art will recognize that changes may be made in form and detail without departing from the spirit and scope of the discussed technology. The implementations described above and other implementations are within the scope of the following claims.

The invention claimed is:

1. A magnetic sensor comprising:
   a magnetoresistive stack positioned between to and bottom shields on an air bearing surface (ABS), the magnetoresistive stack comprises at least a spacer layer disposed between reference and magnetically free laminations, the reference lamination continuously extending to a rear plane, distal the ABS, and separated from the ABS by a front shield having an angled back wall with respect to the ABS, the magnetically free lamination continuously extends from the ABS to the rear plane.

2. The magnetic sensor of claim 1 and further comprising:
   an insulating layer positioned between the front shield and the reference and magnetically free laminations, respectively.

3. The magnetic sensor of claim 1 and further comprising:
   first and second side shields positioned on opposite sides of the reference lamination.

4. The magnetic sensor of claim 3, wherein the first and second side shields are in magnetic contact with the front shield.

5. The magnetic sensor of claim 4, wherein theから shield, is in magnetic contact with at least one of the top shield and a bottom shield.

6. The magnetic sensor of claim 5 and further comprising:
an insulating layer positioned between the magnetoresistive stack and the から shield, first side shield, and second side shield.

7. The magnetic sensor of claim 3, wherein first and second side shields comprise a soft magnetic material.

8. The magnetic sensor of claim 3, wherein the top shield, bottom shield and first and second side shields comprise magnetically soft insulating material.

9. The magnetic sensor of claim 1, wherein the bottom shield is coupled to the magnetically free lamination and connected to an insulating layer such that sense current flow is confined to a region proximate the ABS.

10. The magnetic sensor of claim 1, wherein the back wall of the front shield facilitates increased magnetic flux flow from the media confronting surface into the magnetoresistive stack.

11. The magnetic sensor of claim 1, wherein the reference lamination comprises a nonmagnetic layer, magnetic pinning layer, and antiferromagnetic layer.

12. The magnetic sensor of claim 1, wherein the front shield separates the spacer layer from the ABS.

13. The magnetic sensor of claim 1, wherein the magnetically free lamination has a first ferromagnetic freelayer directly coupled to a second ferromagnetic freelayer.

14. The magnetic sensor of claim 13 wherein the first freelayer comprises a material Chosen from the group of: GdFe, GdCoFe, TbCo, TbCoFe, other Co alloys, other Fe alloys, Pt alloys, Pd alloys, and bilayers of Co and Pt, Fe and Pt, CoCr and Pt, CoFe and Pt, Co and Pd, Fe and Pd, CoCr and Pd, and CoFe and Pd.

15. The magnetic sensor of claim 13 wherein the second freelayer comprises a material chosen from the group of CoFeB, Co, Fe, Ni, CoFeB alloys, other Co alloys, other Fe alloys, Ni alloys, CoB, CoRu, CoRh, and CoPt.

16. The magnetic sensor of claim 13, wherein the second ferromagnetic freelayer is positioned between the first ferromagnetic freelayer and the spacer layer.

17. The magnetic sensor of claim 16, wherein the second ferromagnetic freelayer is recessed from the ABS by an insulating layer.

18. An apparatus comprising:
magnetoresistive stack configured with an air bearing surface (ABS) and having a spacer layer disposed between a reference lamination a magnetically free lamination, the reference lamination continuously extending to a rear plane, distal the ABS, and separated from the ABS by a front shield having an angled back wall with respect to the ABS, the magnetically free lamination continuously extending from the ABS to the rear plane, the magnetically free lamination having a first freelayer extending from the rear plane to the ABS and a second freelayer extending from the rear plane to a front plane, the front plane distal the ABS.

19. A data reader comprising:
a magnetoresistive stack having a spacer layer disposed between a reference lamination and a magnetically free lamination, the reference lamination continuously extending from a rear plane to a front plane, the magnetically free lamination continuously extending from the rear plane to an air bearing surface (ABS), the front plane separated from the ABS by a front shield having an angled back wall with respect to the ABS.

20. The data reader of claim 19, wherein the magnetically free lamination comprises first and second free layers contactingly adjacent each other.

* * * * *

UNITED STATES PATENT AND TRADEMARK OFFICE
CERTIFICATE OF CORRECTION

PATENT NO.       : 8,395,867 B2
APPLICATION NO.  : 12/405051
DATED            : March 12, 2013
INVENTOR(S)      : Dimitar Velikov Dimitrov et al.

It is certified that error appears in the above-identified patent and that said Letters Patent is hereby corrected as shown below:

In the Claims:

In Col. 8, line 52, Claim 1,
replace "to"
with "top"

In Col. 9, line 9, Claim 6,
replace "from"
with "front"

Signed and Sealed this
Twenty-fourth Day of September, 2013

Teresa Stanek Rea
*Deputy Director of the United States Patent and Trademark Office*